(12) United States Patent
Chan

(10) Patent No.: US 7,981,592 B2
(45) Date of Patent: Jul. 19, 2011

(54) DOUBLE PATTERNING METHOD

(75) Inventor: Michael Chan, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 538 days.

(21) Appl. No.: 12/222,293

(22) Filed: Aug. 6, 2008

(65) Prior Publication Data

US 2009/0258318 A1    Oct. 15, 2009

Related U.S. Application Data

(60) Provisional application No. 61/071,091, filed on Apr. 11, 2008.

(51) Int. Cl.
    *G03F 7/26* (2006.01)
(52) U.S. Cl. ......................... 430/314; 430/394
(58) Field of Classification Search .................. 430/329, 430/312, 314, 313, 315, 316, 394
    See application file for complete search history.

(56) References Cited

U.S. PATENT DOCUMENTS

| | | | |
|---|---|---|---|
| 4,201,800 A | 5/1980 | Alcorn et al. | |
| 5,024,971 A | 6/1991 | Baker et al. | |
| 5,482,885 A | 1/1996 | Lur et al. | |
| 5,652,084 A * | 7/1997 | Cleeves ........................ | 430/315 |
| 5,667,940 A | 9/1997 | Hsue et al. | |
| 5,739,068 A | 4/1998 | Jost et al. | |
| 5,915,167 A | 6/1999 | Leedy | |
| 5,977,638 A | 11/1999 | Rodgers et al. | |
| 6,055,180 A | 4/2000 | Gudesen et al. | |
| 6,140,234 A | 10/2000 | Uzoh et al. | |
| 6,221,562 B1 | 4/2001 | Boyd et al. | |
| 6,420,231 B1 | 7/2002 | Harari et al. | |
| 6,423,474 B1 * | 7/2002 | Holscher ........................ | 430/312 |
| 6,492,075 B1 | 12/2002 | Templeton et al. | |
| 6,664,028 B2 * | 12/2003 | Hwang et al. .................. | 430/312 |
| 6,853,049 B2 | 2/2005 | Herner | |
| 6,855,614 B2 | 2/2005 | Metzler | |
| 6,946,719 B2 | 9/2005 | Petti et al. | |

(Continued)

FOREIGN PATENT DOCUMENTS

| | | | |
|---|---|---|---|
| EP | 0 268 739 A2 | 11/1988 | |
| EP | 0 288 739 A2 | 11/1988 | |
| EP | 1 818 977 A2 | 8/2007 | |
| GB | 1 476 585 | 6/1977 | |

(Continued)

OTHER PUBLICATIONS

International Bureau of WIPO. International Preliminary Report on Patentability, Intl. Application PCT/US09/39124. Oct. 21, 2010. 11 pages.

(Continued)

*Primary Examiner* — Kathleen Duda
*Assistant Examiner* — Caleen Sullivan
(74) *Attorney, Agent, or Firm* — The Marbury Law Group, PLLC (57) ABSTRACT

A method of making a device includes forming a first photoresist layer over an underlying layer, patterning the first photoresist layer to form a first photoresist pattern comprising a first grid, rendering the first photoresist pattern insoluble to a solvent, forming a second photoresist layer over the first photoresist pattern, patterning the second photoresist layer to form a second photoresist pattern over the underlying layer, where the second photoresist pattern is a second grid which overlaps the first grid to form a photoresist web, and etching the underlying layer using the photoresist web as a mask.

29 Claims, 8 Drawing Sheets

Coating reacts with residual acids in resist to form barrier layer

U.S. PATENT DOCUMENTS

| | | |
|---|---|---|
| 6,952,030 B2 | 10/2005 | Herner et al. |
| 7,078,348 B1 | 7/2006 | Singh et al. |
| 7,081,377 B2 | 7/2006 | Cleeves |
| 7,176,064 B2 | 2/2007 | Herner |
| 7,211,866 B2 | 5/2007 | Yuan et al |
| 7,271,057 B2 | 9/2007 | Eppich |
| 7,514,204 B2 | 4/2009 | Hatakeyama et al. |
| 2002/0052068 A1 | 5/2002 | Juengling |
| 2002/0172901 A1 | 11/2002 | Tokushima |
| 2003/0157436 A1 | 8/2003 | Manger et al. |
| 2003/0178684 A1 | 9/2003 | Nakamura |
| 2004/0245557 A1 | 12/2004 | Seo et al. |
| 2005/0014385 A1 | 1/2005 | Ghozeil et al. |
| 2005/0052915 A1 | 3/2005 | Herner et al. |
| 2005/0170294 A1 | 8/2005 | Kobayashi |
| 2005/0196684 A1 | 9/2005 | Nakamura et al. |
| 2005/0226067 A1 | 10/2005 | Herner et al. |
| 2006/0035167 A1 | 2/2006 | Angelopoulos et al. |
| 2006/0105476 A1 | 5/2006 | Choi et al. |
| 2006/0154182 A1 | 7/2006 | Brodsky |
| 2006/0216937 A1 | 9/2006 | Dunton et al. |
| 2006/0228895 A1 | 10/2006 | Chae et al. |
| 2006/0250836 A1 | 11/2006 | Herner et al. |
| 2006/0250837 A1 | 11/2006 | Herner et al. |
| 2006/0273298 A1 | 12/2006 | Petti |
| 2006/0292301 A1 | 12/2006 | Herner |
| 2007/0048674 A1* | 3/2007 | Wells ............................ 430/313 |
| 2007/0049035 A1 | 3/2007 | Tran |
| 2007/0072360 A1 | 3/2007 | Kumar et al. |
| 2007/0099431 A1 | 5/2007 | Li |
| 2007/0114509 A1 | 5/2007 | Herner |
| 2007/0158688 A1 | 7/2007 | Caspary et al. |
| 2007/0164309 A1 | 7/2007 | Kumar et al. |
| 2007/0176160 A1 | 8/2007 | Uchiyama et al. |
| 2007/0197014 A1 | 8/2007 | Jeon et al. |
| 2007/0212886 A1* | 9/2007 | Uh et al. ....................... 438/706 |
| 2007/0212889 A1 | 9/2007 | Abatchev et al. |
| 2007/0269746 A1 | 11/2007 | Nakamura |
| 2008/0013364 A1 | 1/2008 | Kumar et al. |
| 2008/0014533 A1 | 1/2008 | Keller et al. |
| 2008/0085600 A1 | 4/2008 | Furukawa et al. |
| 2008/0241736 A1 | 10/2008 | Kobayashi et al. |
| 2008/0248654 A1 | 10/2008 | Jung |
| 2009/0149026 A1 | 6/2009 | Zhou et al. |

FOREIGN PATENT DOCUMENTS

| | | |
|---|---|---|
| JP | 2008-83537 | 4/2008 |
| KR | 2007-0122049 | 12/2007 |
| WO | WO 2008/114644 A1 | 9/2008 |

OTHER PUBLICATIONS

International Bureau of WIPO. International Preliminary Report on Patentability, Intl. Application PCT/US09/02400. Nov. 11, 2010. 11 pages.

International Bureau of WIPO. International Preliminary Report on Patentability, Intl. Application PCT/US09/39121. Oct. 21, 2010. 10 pages.

Office Action mailed Jul. 28, 2009 received in U.S. Appl. No. 12/149,151.

International Search Report and Written Opinion mailed Sep. 7, 2009, received in International Application No. PCT/US2009/002400 (16 pgs.).

Office Action mailed Jul. 22, 2009 received in U.S. Appl. No. 12/000,758.

Office Action mailed Mar. 30, 2009 received in U.S. Appl. No. 11/864,205.

Ishibashi, Takeo et al., "Advanced Micro-Lithography Process for i-line Lithography," Jpn. J. Appl. Phys. vol. 40, Part 1, No. 12, 2001, pp. 7156-7161.

U.S. Appl. No. 11/864,205, filed Sep. 28, 2007, Yung-Tin Chen et al.
U.S. Appl. No. 11/864,532, filed Sep. 28, 2007, Maxwell.
U.S. Appl. No. 12/007,780, filed Jan. 15, 2008, Herner et al.
U.S. Appl. No. 12/007,781, filed Jan. 15, 2008, Dunton et al.
U.S. Appl. No. 12/216,107, filed Jun. 30, 2008, Chan.

Kim, Ryoung H. et al., "Double Exposure Using 193 nm Negative Tone Photoresist", Optical Microlithography XX, Proc of SPIE, vol. 6520, 65202M, 2007, 8 pgs.

Nakamura, Hiroko et al., "Contact Hole Formation by Multiple Exposure Technique in Ultra-low $k_1$ Lithography", Optical Microlithography XVII, Proceedings of SPIE, vol. 5377, Feb. 24-27, 2004, pp. 255-263.

Nakamura, Hiroko et al., "Low $k_1$ Contact Hole Formation by Double Line and Space Formation Method with Contact Hole Mask and Dipole Illumination", The Japan Society of Applied Physics, vol. 45, No. 6B, 2000, pp. 5409-5417.

International Search Report and Written Opinion mailed Jun. 8, 2009 in International Application No. PCT/US2009/039121.

International Search Report and Written Opinion mailed Jun. 8, 2009 in International Application No. PCT/US2009/039124.

Office Action mailed Jul. 8, 2009 in U.S. Appl. No. 12/216,107.
U.S. Appl. No. 09/560,626, filed Apr. 28, 2000, Knall.
U.S. Appl. No. 11/159,031, filed Jun. 22, 2005, Herner.
U.S. Appl. No. 12/000,758, filed Dec. 17, 2007, Petti et al.
U.S. Appl. No. 12/149,151, filed Apr. 28, 2008, Chen et al.
U.S. Appl. No. 12/216,924, filed Jul. 11, 2008, Ping et al.
U.S. Appl. No. 12/222,293, filed Aug. 6, 2008, Chan.
U.S. Appl. No. 12/285,466, filed Oct. 6, 2008, Chung-Ming Wang et al.

Partial International Search Report mailed Oct. 21, 2009, in International Application No. PCT/US2009/048584.

International Search Report and Written Opinion mailed Oct. 9, 2009, received in International Application No. PCT/US2009/048581.

* cited by examiner

Fig. 2A  First image defined

Fig. 2B  Apply protective coating

Fig. 2C  Coating reacts with residual acids in resist to form barrier layer

Fig. 2D  Barrier now "protects" around first image

Fig. 2E  Apply resist #2 (thinner viscosity), shift, and expose

Fig. 2F  Develop to reveal first and second resist patterns; pitch doubles

Post Double Patterning

Second Masking contact holes, 506

First Masking

Fig. 5

DOUBLE PATTERNING METHOD

BACKGROUND OF THE INVENTION

The invention relates generally to a photolithography method for making a semiconductor device, for example, a diode containing nonvolatile memory array.

Figure 1A:
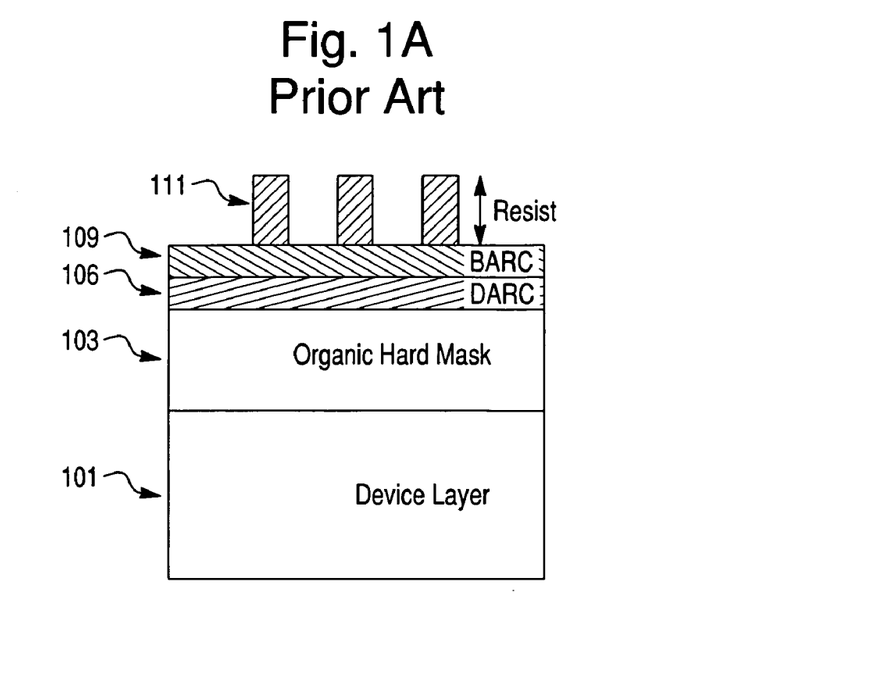
FIG. 1A is a side cross-sectional view illustrating a prior art hard mask configuration.

One prior art process using a hard mask stack shown in FIG. 1A can be used to fabricate 45 nm and 80 nm features. The stack consists of a layer of organic hard mask 103, also known as an amorphous carbon advanced patterning film (APF), a layer of Dielectric Anti-Reflective Coating (DARC) 106, such as silicon oxynitride, on top of organic hard mask 103, and a Bottom Anti-Refection Coating (BARC) 109 layer, such as an organic BARC layer, on top of DARC layer 106. A photoresist 111 can be coated above the BARC layer.

SUMMARY OF THE EMBODIMENTS

One embodiment of the invention provides a method of a method of making a device, comprising forming a first photoresist layer over an underlying layer, patterning the first photoresist layer to form a first photoresist pattern comprising first photoresist lines extending in a first direction, rendering the first photoresist pattern insoluble to a solvent, forming a second photoresist layer over the first photoresist pattern, patterning the second photoresist layer to form a second photoresist pattern over the underlying layer, the second photoresist pattern comprising second photoresist lines extending in a second direction different from the first direction, and etching the underlying layer using both the first and the second photoresist patterns as a mask.

Another embodiment of the invention provides a method of making a device includes forming a first photoresist layer over an underlying layer, patterning the first photoresist layer to form a first photoresist pattern comprising a first grid, rendering the first photoresist pattern insoluble to a solvent, forming a second photoresist layer over the first photoresist pattern, patterning the second photoresist layer to form a second photoresist pattern over the underlying layer, where the second photoresist pattern is a second grid which overlaps the first grid to form a photoresist web, and etching the underlying layer using the photoresist web as a mask.

Another embodiment of the invention provides a method of making a device comprising forming a first photoresist layer over an underlying layer, patterning the first photoresist layer to form a first photoresist pattern comprising first photoresist lines extending in a first direction, rendering the first photoresist pattern insoluble to a solvent, forming a second photoresist layer over the first photoresist pattern, patterning the second photoresist layer to form a second photoresist pattern over the underlying layer, the second photoresist pattern comprising second photoresist lines extending in a second direction different from the first direction, etching the underlying layer using both the first and the second photoresist patterns as a mask to form openings in the underlying layer, and filling the openings with at least one semiconductor material to form a semiconductor diodes having a substantially pillar shape in the openings.

DETAILED DESCRIPTION OF THE PREFERRED EMBODIMENTS

Figure 2A:
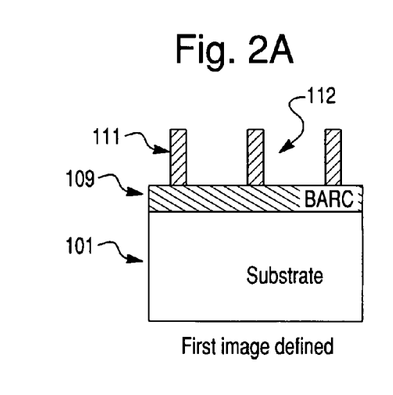
FIGS. 2A-2F, 3A-3C and 4A-4C are side cross-sectional views illustrating process flows of embodiments of the invention.

One embodiment of the invention provides a method of making a device, comprising forming a first photoresist layer over an underlying layer, as shown in FIG. 2A. The underlying layer is selected from one or more of the BARC layer (which can be an organic dielectric material), the DARC layer, the organic hard mask layer (such as the amorphous carbon advanced patterning film (APF)) and/or the device layer (such as an insulating, semiconductor or a conductive layer), as shown in FIG. 1A. Preferably, the organic hard mask layer is formed over the device layer, the DARC layer is formed over the organic hard mask layer, and the BARC layer is formed over the DARC layer. An optional silicon oxide hard mask layer can be formed over the organic hard mask layer and under the DARC layer. If desired, the BARC layer may be omitted if the oxide hard mask is provided. Any one or more of the hard mask and antireflective layers can be omitted. Only the BARC layer 109 and the photoresist layer are shown for clarity over the substrate or device layer 101 in FIG. 2A. The first photoresist layer is patterned to form a first photoresist pattern 111.

Figure 2B:
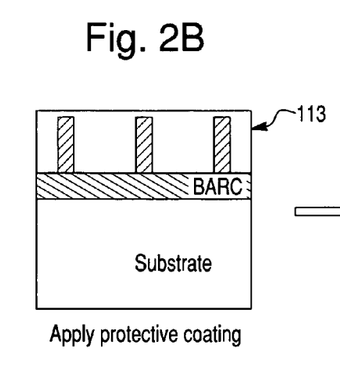
Figure 2C:
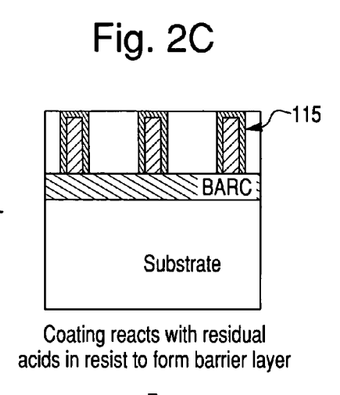
Figure 2D:
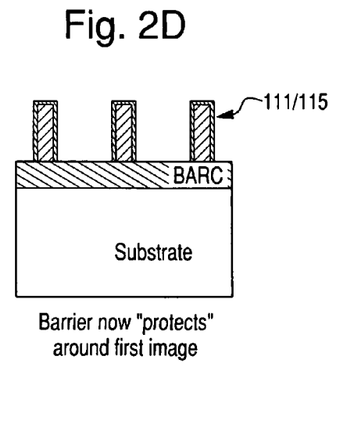

In some embodiments, a barrier layer is formed on the first photoresist pattern 111 by applying a reactive reagent layer 113 over the pattern, as shown in FIG. 2B, causing the residual acids in the resist pattern 111 to chemically react with layer 113 to form a barrier layer or coating 115 on the resist pattern 111 upper and side surfaces (i.e., to "freeze" the resist pattern 111), as shown in FIG. 2C, and selectively removing the residual portions of layer 113, as shown in FIG. 2D. Reactive agents using other "freezing" mechanisms can also be used to form the barrier layer or coating.

Figure 2E:
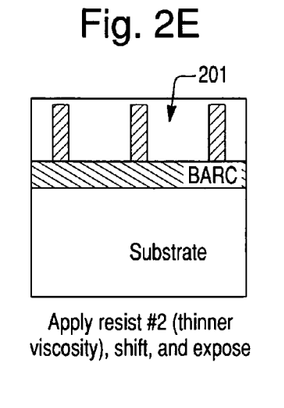
Figure 2F:
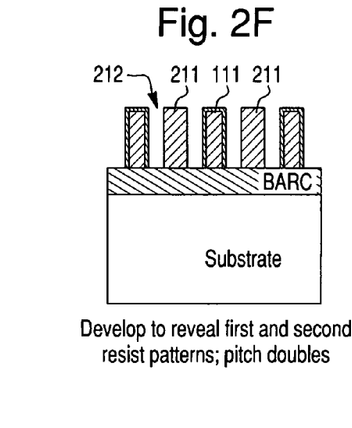

A second photoresist layer 201 is formed over the barrier layer 115 on the first photoresist pattern 111, as shown in FIG. 2E. The second photoresist layer is then patterned to form a second photoresist pattern 211 over the underlying layer as shown in FIG. 2F, to double the pitch of the patterns. The underlying layer is then etched using both the first and the second photoresist patterns as a mask. The first photoresist layer comprises a first composition and the second photoresist comprises a second composition. The first composition and the second composition can be same or different. For example, the second composition may have a thinner viscosity than the first composition.

The barrier layer 115 comprises a thin polymer film (such as a monolayer film) having a thickness of less than 10 nm, preferably about 1-2 nm, which is disposed on a surface of the first photoresist pattern 111. The increase in critical dimension of the first photoresist pattern before and after forming barrier layer 115 may or may not be observable. The underlying layer 109 is exposed in first openings 112 in the first photoresist pattern. The barrier layer protects the first photoresist pattern from being dissolved by a solvent during the step of patterning the second photoresist layer.

The first and second photoresist materials may be any suitable photoresist material(s), preferably acrylate materials, such as poly(methyl acrylate) or poly(methyl methacrylate). The first and second photoresist materials may be same or different materials. In some embodiments, the barrier layer 115 is formed by reacting the first photoresist pattern with a reactive material 113 to form the monolayer thick polymeric barrier layer. This barrier layer can be formed by causing cross-linking on the surface of the pattern 111 or by any other suitable methods. In some embodiments, when the first photoresist is an acrylic material, the freezing reagent may be the same acrylic material with an active functional group on the side chain. The reactive material 113 can be a chemical shrink material, such as CSX004, FZX F112, or FZX F114 which comprises a poly(methyl)acrylate derivative, melamine resin, and other ingredients including water, methyl isobutyl carbinol, n-butyl alcohol, or combination thereof. For example, FZX F114 comprises a poly(methyl)acrylate derivative, and a solvent containing methyl isobutyl carbinol and n-butyl alcohol having a volume ratio of 70:30 to 90:10, such as a volume ratio of 80:20. CSX004, FZX F112, and FZX F114 are all available from JSR Micro (http://www.jsr-micro.com). Another shrink material, RELACS® available from AZ Electronic Materials or other reactive reagents which are used in the prior art to reduce the dimensions of openings between adjacent resist patterns (i.e., which are used to widen small resist patterns), may also be used. The cross-linking may be achieved by heating material 113 for 1-2 minutes at a temperature between 130° C. and 180° C. The removal of material 113 may be achieved by development in suitable developer solution followed by a second heating step. For example, the methods described in U.S. patent application Ser. No. 11/864,205, which is incorporated by reference in their entirety, may be used.

Other freezing methods may also be used to protect the first photoresist pattern from being dissolved by a solvent(s) used (i.e. to render the first photoresist pattern insoluble) in the step of patterning the second photoresist layer. For example, a protective agent may selectively replace some functional groups of the first photoresist polymer, which in turn renders the first photoresist insoluble to the solvent(s). Alternatively, the first photoresist may crosslink with a compatible chemistry under a desired condition, such as an application of heat (e.g. a high temperature bake), or other desired treatments, to "freeze" the first photoresist pattern.

In some embodiments, the first photoresist pattern 111 comprises first openings 112, the first photoresist pattern is formed by a first exposure using a first photo mask, the second photoresist pattern 211 is formed in the first openings 112 such that second openings 212 remain between adjacent portions of the first and the second photoresist patterns. The second photoresist pattern is formed by a second exposure using a second photo mask. A combination of the first and the second photoresist patterns can have a final pitch that is double a pitch of the first photoresist pattern. The photo masks used in pattering the first photoresist layer and patterning the second photoresist layer can be the same (with shifting of mask position) or different. In some embodiments, features of "frozen" first photoresist pattern may be used as alignment marks for the second exposure.

One or more photosensitive layers can be formed and patterned over the stack described above. For example, 193 nm radiation sensitive photoresist and TArF P6239 can be used. Other photosensitive layer or layers may also be used. Immersion lithography (i.e., a lithography which utilizes a liquid at the interface) may be used to expose the photoresist, in which water or other high-index fluids may be used as an immersion medium. A regular dry lithography may also be used. A topcoat may be used on top of the photoresist to prevent diffusion of chemical by-products into water and lens during exposure. Alternatively, a top-coat free photoresist may be used. Other lithography methods, including but not limited to regular UV or X-ray methods, may also be used.

Figure 2G:
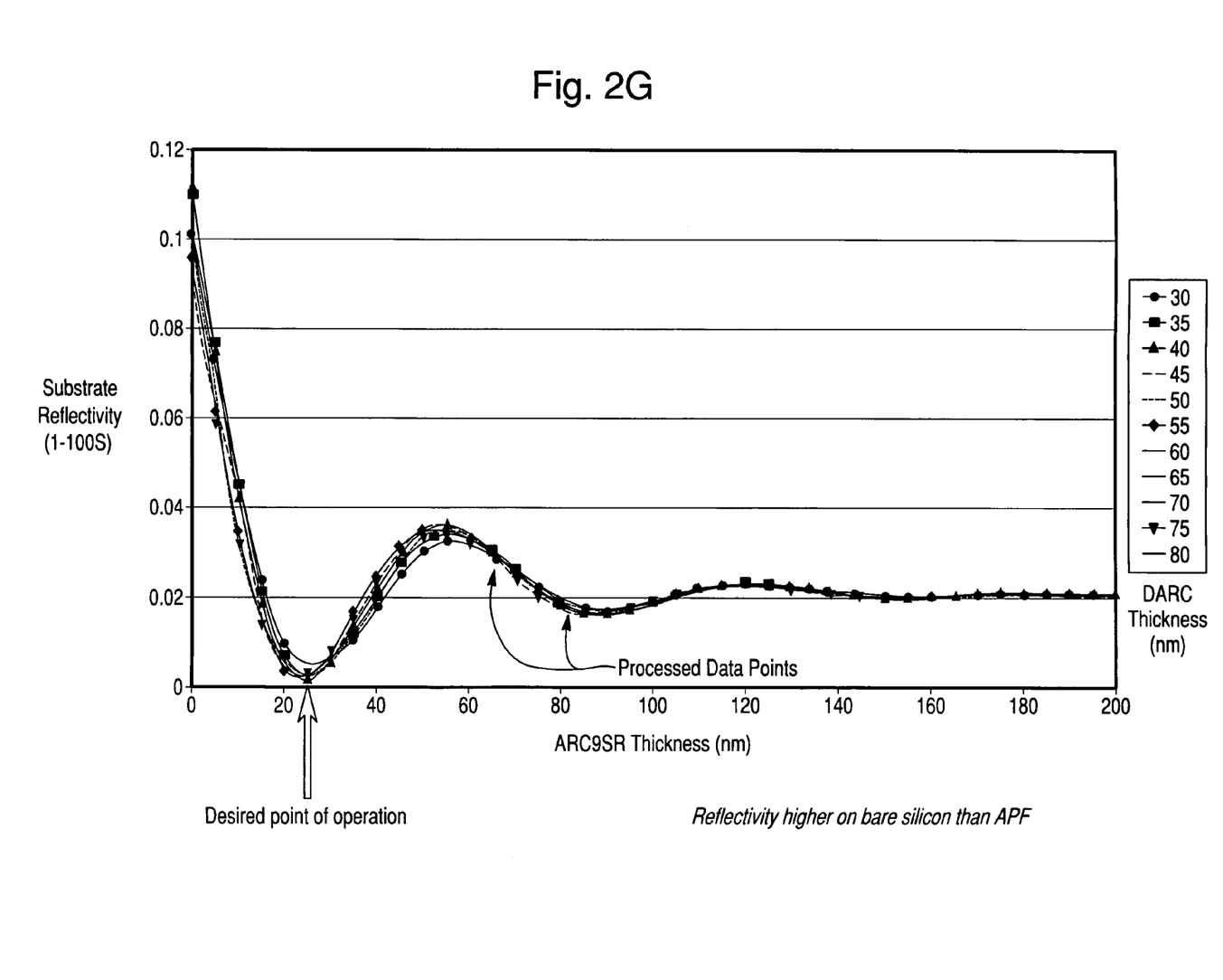
FIG. 2G is a plot of substrate reflectivity versus BARC layer thickness as a function of DARC layer thickness.

A Bottom Anti-reflective Coating (BARC) layer, with a desired thickness, may be added to improve the performance of the photo resist by forming a sharper resist contrast after double patterning. For example, a surface reflectivity can be tested on stacks with a silicon oxynitride DARC and a BARC layer having various thicknesses, to determine an optimum point of operation. As shown in FIG. 2G, an optimized surface reflectivity is obtained when a combination of around 15-30 nm, such as about 20-25 nm, such as 24 nm ARC29SR (a commonly used BARC material available from Brewer Science) with a DARC layer is used. The thickness of the DARC layer does not show significant impact on the surface reflectivity in this experiment, as also shown in FIG. 2G. In this experiment, a 193 nm photoresist is used. When other photoresists or other BARC materials are used, the optimized surface reflectivity may be obtained at different conditions.

Figure 2H:
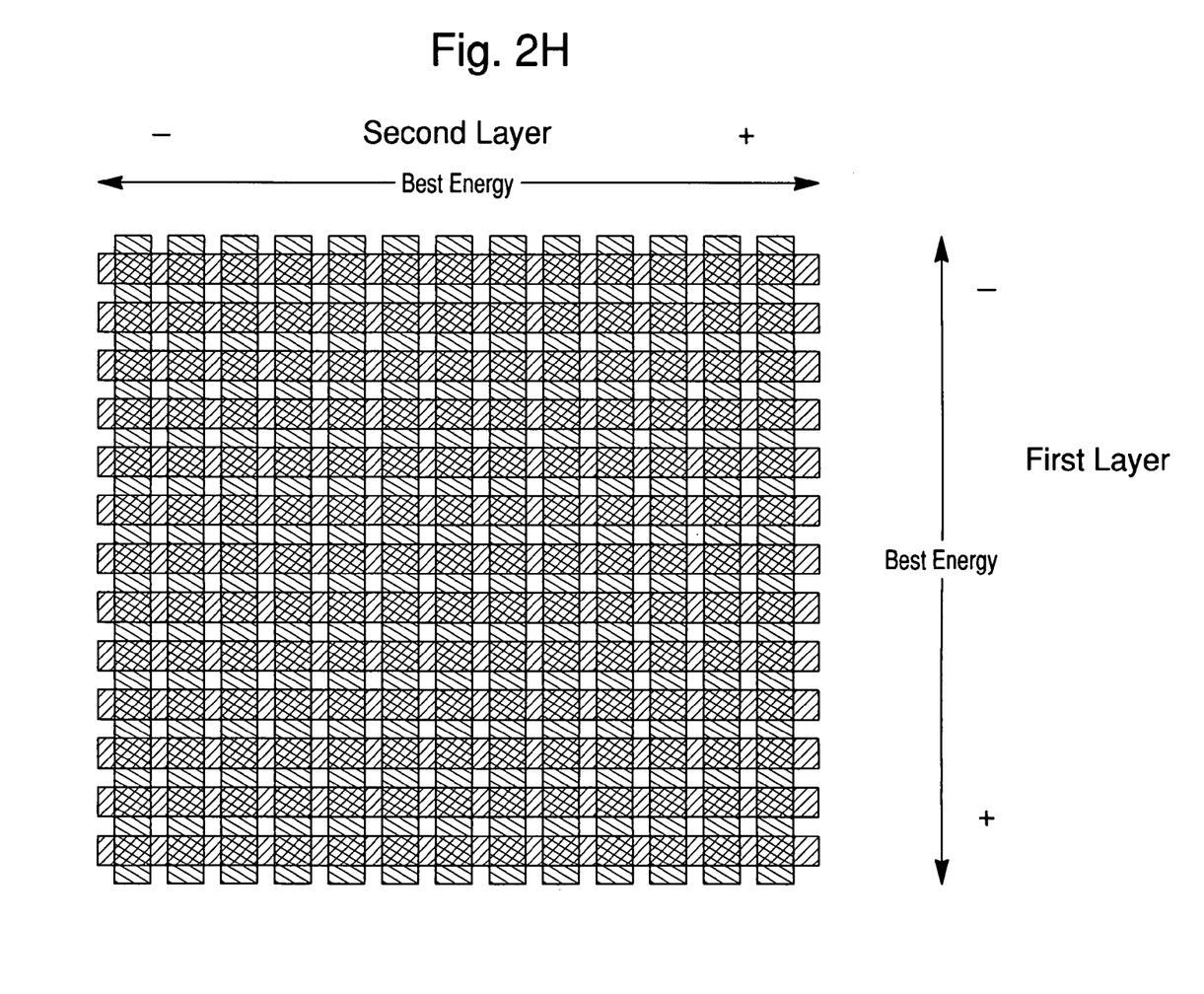
FIG. 2H is a illustrative top view of a matrix of a first radiation energy dose and a second radiation energy dose applied for patterning the first photoresist layer and patterning the second photoresist layer respectively.

Exposure doses used to size the photoresist into the correct critical dimension (CD) in double patterning is another important factor, and may not show a linear correlation with the resulting CD. Thus, some interaction effects cannot be fully captured through simulations. For example, the photoresist CD might get bigger or smaller after the step of the first photoresist freeze (depending on the chemistries involved), and then can get either bigger or smaller again after the second photoresist patterning. Therefore, an optimized set of exposure doses to apply with a particular chemical combination may be different to simulate. Thus, a matrix of first and second exposure doses (as shown in FIG. 2H) may be tested, on a single wafer at an predetermined focus setting, to determine an optimum set of exposure doses (i.e., a optimum value of a first exposure radiation energy for patterning the first photoresist, and an optimum value of a second exposure radiation energy for patterning the second photoresist) for double patterning.

If the DARC layer and organic hard mask (such as APF) layers are located between the photoresist and device layer, then the DARC layer is patterned using the combination of the first and the second photoresist patterns as a mask, an the organic hard mask layer is patterned using at least the patterned DARC layer as a mask, and the device layer is patterned using at least the organic hard mask layer as a mask. Photoresist layer patterns 111 and 211 may be consumed in the step of APF 103 etching, the DARC 106 (and optional oxide hard mask) may be consumed in the step of device layer 101 etching, while at least lower portion of APF layer 103 may still remain after device layer etching. The remaining APF layer 103 can then be stripped. Multiple etching steps may be conducted in one chamber or in plural chambers of a multi-chamber apparatus without breaking the vacuum.

In one embodiment, the device layer comprises a conductive material, such as a metal or metal alloy, which is patterned into line shaped electrodes. In another embodiment, the device layer comprises at least one semiconductor layer, and the step of patterning the device layer forms an array of semiconductor pillars, and each pillar in the array of pillars comprises a diode. The diode may be a steering element of a memory cell which also includes a storage element.

Alternatively, the device layer may comprise an insulating layer which is patterned into a desired shape or where openings or vias are etched in the insulating layer. In some embodiments, the openings of the patterned insulating layer can then be filled with at least one semiconductor material to form substantially pillar shaped devices, such as diodes or transistors in the openings. In some embodiments, the semiconductor material is selectively deposited into the openings. In other embodiments, the semiconductor material is deposited non-selectively over the device layer and into the openings, followed by planarizing the semiconductor material such that the semiconductor material remains in the openings. U.S. application Ser. Nos. 12/007,780 and 12/007,781, filed on Jan. 15, 2008, incorporated by reference in their entirety, disclose exemplary methods for forming pillar shaped devices in openings in an insulating layer. The pillar shaped devices, such as diodes, can act a steering element of a nonvolatile memory cell. The memory cell further comprises a storage element, as will be described in more detail below. In some embodiments, more than one semiconductor material can be provided into the openings, such as semiconductor materials of different conductivity type or different composition. The semiconductor material can be any suitable semiconductor material, such as silicon, germanium, silicon germanium, or other compound semiconductor materials. The conductivity type of the semiconductor material can be n-type, p-type, or intrinsic.

In some embodiments, the storage element comprises a resistivity switching element. The resistivity switching element can be a metal oxide antifuse dielectric layer or another element, and the diode and the metal oxide antifuse dielectric layer can be arranged in series. The memory cell can be further located in a monolithic three dimensional array of memory cells. The memory cell can be a read/write memory cell or a rewritable memory cell. The memory cell type can be selected from at least one of antifuse, fuse, polysilicon memory effect cell, metal oxide memory, switchable complex metal oxide, carbon nanotube memory, graphene, amorphous or polycrystalline carbon switchable resistance material, phase change material memory, conductive bridge element, or switchable polymer memory. U.S. application Ser. Nos. 11/864,532 and 11/819,595, U.S. Published Application Numbers US 2007/0164309 A1 and US 2007/0072360 A1, and U.S. Pat. Nos. 6,946,719, 6,952,030, 6,853,049, disclosing memory cells and methods of making and/or using thereof, are hereby incorporated by reference in their entirety.

Figure 1B:
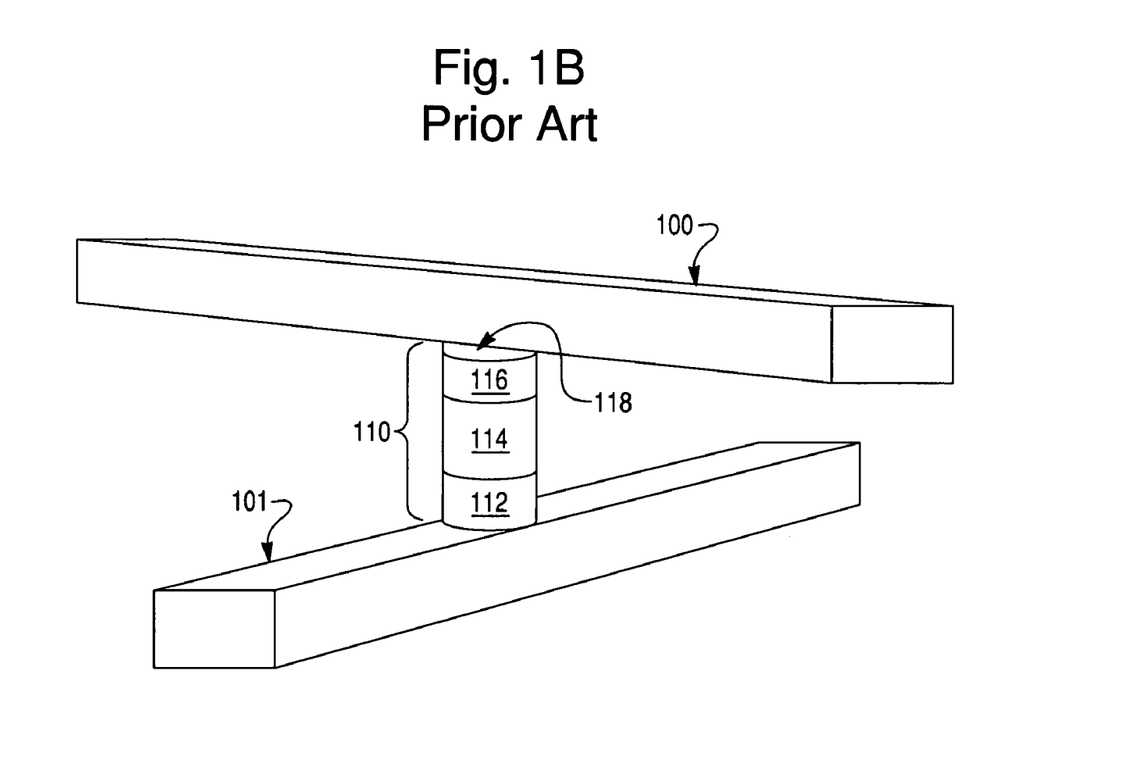
FIG. 1B is a perspective view of a memory cell formed according to a preferred embodiment of the present invention.

In preferred embodiments, the memory cell includes a cylindrical semiconductor diode is located in series with the storage element. The diode and the film are disposed between two electrodes, as illustrated in FIG. 1B. The diode and the storage element may have a shape other than cylindrical, if desired. For a detailed description of a the design of a memory cell comprising a diode and a metal oxide, see for example U.S. patent application Ser. No. 11/125,939 filed on May 9, 2005 (which corresponds to US Published Application No. 2006/0250836 to Herner et al.), and U.S. patent application Ser. No. 11/395,995 filed on Mar. 31, 2006 (which corresponds to US Patent Published Application No. 2006/0250837 to Herner et al.,) each of which is hereby incorporated by reference. In the preferred embodiments of the invention, the storage element film serves as the resistivity switching element and the diode as the steering element of the memory cell.

As a non-limiting example, FIG. 1B illustrates the perspective view of a memory cell formed according to a preferred embodiment of the present invention. A bottom conductor 101 is formed of a conductive material, for example tungsten, and extends in a first direction. Barrier and adhesion layers, such as TiN layers, may be included in bottom conductor 101. The semiconductor diode 110 has a bottom heavily doped n-type region 112; an intrinsic region 114, which is not intentionally doped; and a top heavily doped p-type region 116, though the orientation of this diode may be reversed. Such a diode, regardless of its orientation, will be referred to as a p-i-n diode or simply diode. The resistivity switching layer 118 is disposed on the diode, either on the p-type region 116 or below the n-region 112 of the diode 110. Top conductor 100 may be formed in the same manner and of the same materials as bottom conductor 101, and extends in a second direction different from the first direction. The semiconductor diode 110 is vertically disposed between bottom conductor 101 and top conductor 100. The diode can comprise any single crystal, polycrystalline, or amorphous semiconductor material, such as silicon, germanium, or silicon-germanium alloys.

The memory cell may be fabricated by any suitable methods. For example, the methods described in U.S. patent application Ser. No. 11/125,939 filed on May 9, 2005 (which corresponds to US Published Application No. 2006/0250836 to Herner et al.), and U.S. patent application Ser. No 11/395, 995 filed on Mar. 31, 2006 (which corresponds to US Patent Published Application No. 2006/0250837 to Herner et al.,) which are incorporated by reference in their entirety may be used.

The above described memory cell shown in FIG. 1B may be located in a one memory level device. If desired, additional memory levels can be formed above the first memory level to form a monolithic three dimensional memory array. In some embodiments, conductors can be shared between memory levels; i.e. top conductor 100 shown in FIG. 1B would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

In another embodiment of the invention, instead of using a regular contact hole mask, a reticle with complementary horizontal and vertical lines are exposed in succession through the double patterning technique described in the prior embodiments to yield contact holes in the open areas adjacent to the points of intersection.

In one embodiment, using the above described double patterning method, two layouts of horizontal and vertical lines can be printed in an overlapping fashion such that the common spaces or openings shared by the intersecting lines are used to form contact holes in the subsequent etch step. This method includes forming a first photoresist layer over an underlying layer. The underlying layer is selected from one or more of a bottom antireflective coating (BARC) layer (which can be an organic dielectric material), a dielectric antireflective coating (DARC) layer (which can be a silicon oxynitride layer, for example), an organic hard mask layer (such as an amorphous carbon advanced patterning film (APF)) and/or a device layer (such as an insulating, semiconductor or a conductive layer). Preferably, the organic hard mask layer is formed over the device layer, the DARC layer is formed over the organic hard mask layer, and the BARC layer is formed over the DARC layer. An optional silicon oxide hard mask layer can be formed over the organic hard mask layer and under the DARC layer. Any one or more of the hard mask and antireflective layers can be omitted.

Figure 3A:
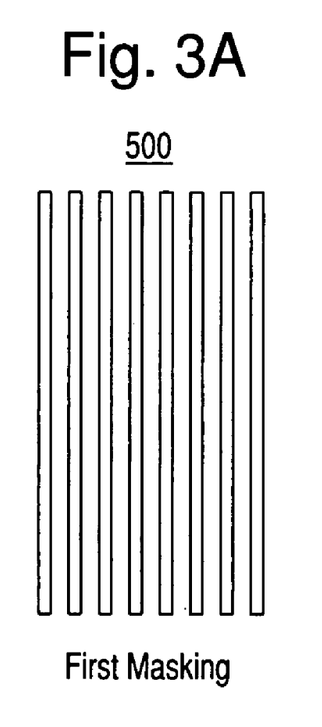

The first photoresist layer is then patterned to form a first photoresist pattern comprising first photoresist lines 500 extending in a first direction, as shown in FIG. 3A. Then, the barrier layer is formed on the first photoresist pattern (i.e., on the top and sidewalls of the lines 500) using the method described in the prior embodiment to "freeze" the first photoresist pattern.

Figures 3B, 3C:
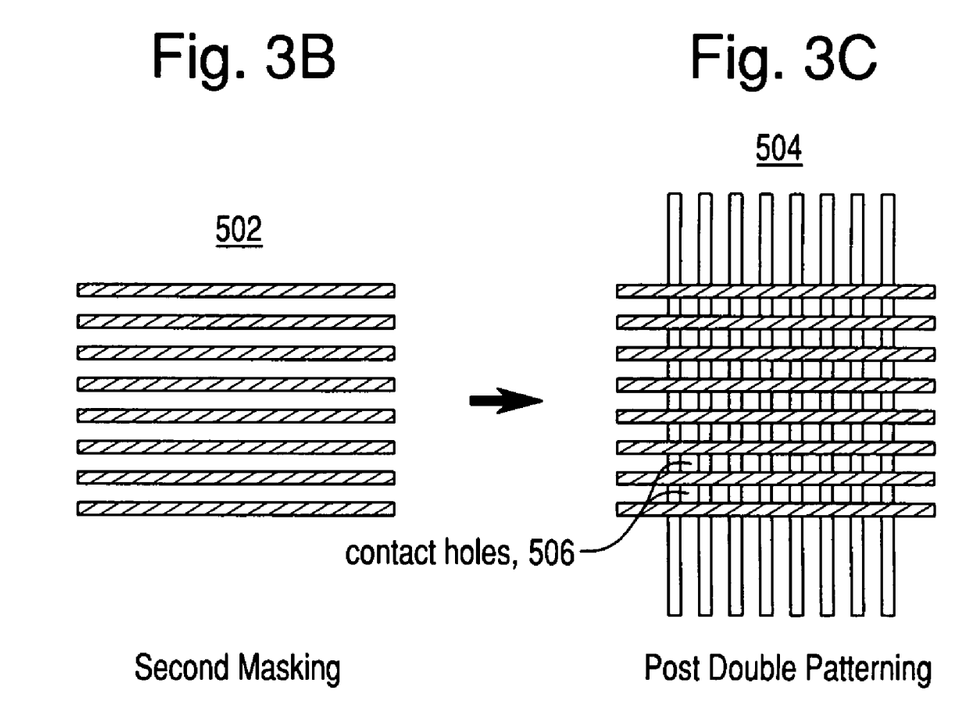

A second photoresist layer is formed over the first photoresist pattern. The second photoresist layer is patterned to form a second photoresist pattern over the underlying layer. The second photoresist pattern comprises second photoresist lines 502 extending in a second direction different from the first direction, as shown in FIG. 3B. The first direction may differ from the second direction by 30 to 90 degrees. For example, lines 500 may be vertical lines and lines 502 may be horizontal lines which are perpendicular to lines 500, or vice-versa. Alternatively, lines 500 and 502 may extend in non-perpendicular directions such that lines 500 and 502 are diagonal with respect to each other.

The first and the second patterns (i.e., lines 500 and 502) form a photoresist grid 504 when lines 502 overlie lines 500, as shown in FIG. 3C. A grid comprises an open frame work of crossed segments or lines, such as the exemplary "checkerboard" shaped grid 504. Openings 506 are located between the photoresist lines 500 and 502. The underlying layer is exposed through the openings. While a rectangular "checkerboard" grid 504 is shown in FIG. 3C, it should be understood that other grid types may also be used. For example, if lines 500 and 502 are diagonal with respect to each other, then rhombus shaped or substantially circular shaped (e.g., a smoothed out rhombus shaped), rather than square or rectangular openings 506 are provided in the grid 504.

The first photoresist layer and the second photoresist layer may be exposed through a different photo mask during their respective exposure steps. Alternatively, the first photoresist layer and the second photoresist layer are exposed through a same photo mask which is positioned in a different orientation with respect to the underlying layer during exposure of the first and the second photoresist layers. In other words, the photo mask used to expose the first photoresist layer during formation of the vertical lines 500 in the first photoresist layer is rotated 90 degrees and is then used to expose the second photoresist layer which results in the horizontal lines 502 after the second photoresist layer is developed. The first and the second photoresist layers may have the same or different compositions.

Then, the underlying layer is patterned (i.e., etched) using both the first and the second photoresist patterns (i.e., using the grid 504) as a mask. The underlying layer portions exposed in the openings are etched away while the remaining portions covered by the grid 504 remain. For example, at least one of the BARC layer and the DARC layer is etched using the first and the second photoresist patterns as a mask. The photoresist patterns (i.e., grid 504) may be removed after this etching step or it may be left in place. For example, the BARC and the DARC layers may be etched together. Alternatively, the BARC layer is etched first and the DARC layer is etched separately using the patterned BARC layer as a mask, before or after removing the grid 504. If the optional oxide hard mask layer is present under the DARC layer, then it is etched together with the DARC layer. Then, the organic hard mask layer is patterned using at least the patterned DARC layer (or both BARC and DARC layers and/or oxide hard mask) as a mask. Then, the device layer is patterned using at least the patterned organic hard mask layer (and optionally the BARC, DARC and/or oxide hard mask as well) as a mask.

Thus, using double patterning techniques, the openings or common spaces 506 shared by overlapping horizontal 502 and vertical 500 photoresist lines can be used to form contact holes in an insulating device layer. The contact holes may extend to semiconductor devices and/or electrodes of such devices located below the insulating device layer.

In another embodiment, rather than forming contact openings or vias in the device layer, pillars may be formed in the underlying device layer instead. In this method, the openings 506 are filled with a masking material to form a masking material pattern. The masking material may comprise a conductive material, such as tungsten, an inorganic insulating material, such as silicon oxide, silicon nitride or siloxane based spin-on-glass, an organic insulating material, a semiconductor material. The masking material may be formed as a layer over the photoresist grid 504 and then planarized by CMP to form the masking material pattern which remains only in the openings 506. Alternatively, the masking pattern may be formed in the openings 506 by spin coating or other liquid phase deposition method without the CMP step. The first and the second photoresist patterns (i.e., the grid 504) is then selectively removed, such as by selective etching, to leave the masking material pattern (which corresponds to the location of the openings 506) over the underlying layer. The underlying layer is then patterned using the masking material pattern as a mask to form pillar structures in the underlying layer. The masking material pattern may be removed at any time after the patterning of the BARC, DARC, organic hard mask and/or device layer. This method may be used to form semiconductor pillars in the device layer, such as pillar shaped diodes which can be used as steering elements of a nonvolatile memory device described herein.

In another embodiment, in order to provide an improved resolution to resolve contact hole features at the 32 nm half pitch node and below, such as contact hole features at a 22 nm half pitch node, each photoresist pattern comprises a separate grid to form a web-like checkerboard layout scheme to achieve the double-patterning effect for contact holes and pillar devices.

Figure 4A:
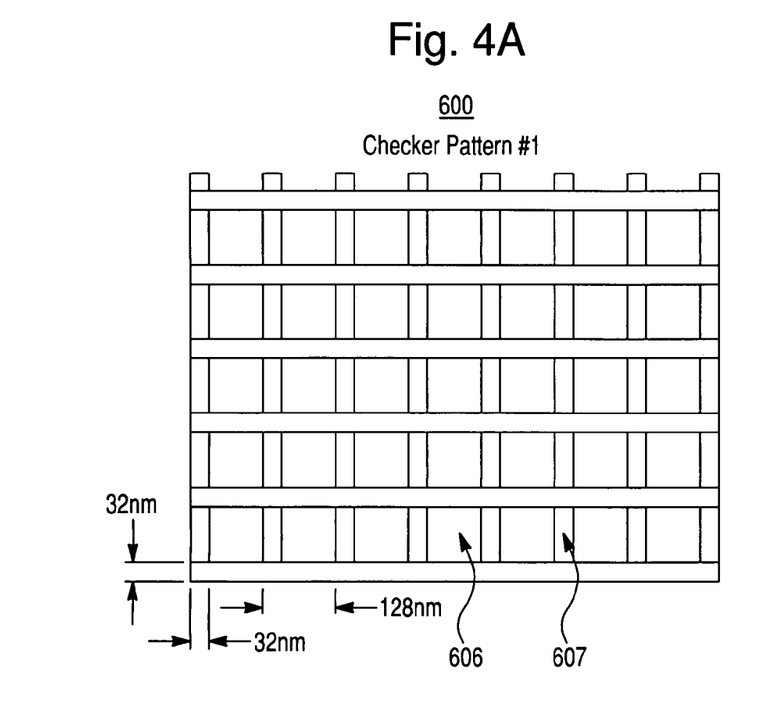

As shown in FIG. 4A, the first photoresist layer is formed over the underlying layer. As described with respect to the prior embodiment, the underlying layer is selected from one or more of the BARC layer, a DARC layer, an organic hard mask layer and/or a device layer. The first photoresist layer is patterned to form a first photoresist pattern comprising a first grid 600. For a square shaped grid, each opening 606 between segments 607 is square. The openings 606 may have a height and width of 100 to 200 nm, such as 128 nm for example. The segments 607 may be 20 to 50 nm thick, such as 32 nm or smaller half-pitch for example. While a rectangular grid with rectangular or square openings 606 is shown, it should be noted that other grid shapes may be used instead. For example, the grid may contain rhombus shaped, hexagonal, triangular, or other polygonal shaped openings, or circular or oval shaped openings between the grid segments 607. Furthermore, while the openings 606 are shown as being fully enclosed by the grid segments, it is possible to form a partial grid where the openings are not enclosed on one or more sides.

A barrier layer is then formed on the first photoresist pattern (i.e., on the top and sidewalls of the grid 600 segments 607) using the above described method to "freeze" grid 600.

Figure 4B:
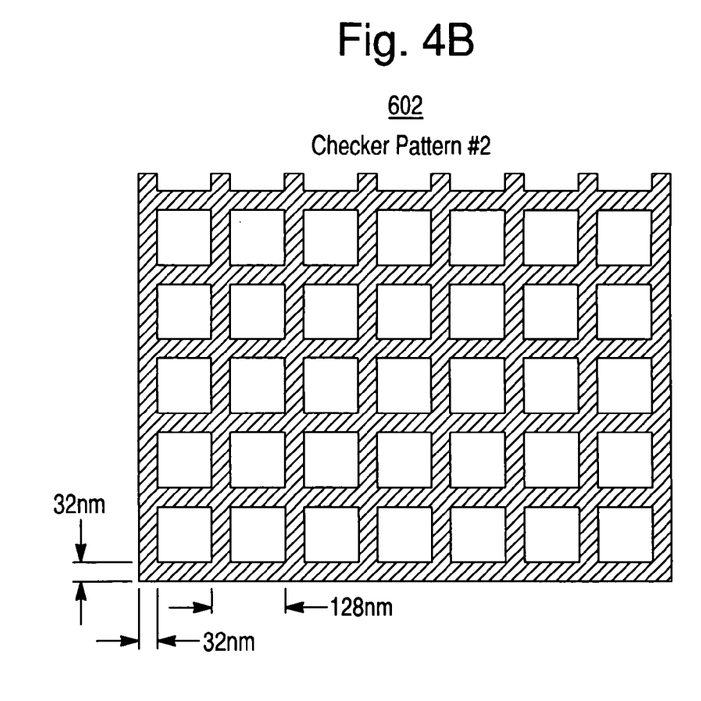
Figure 4C:
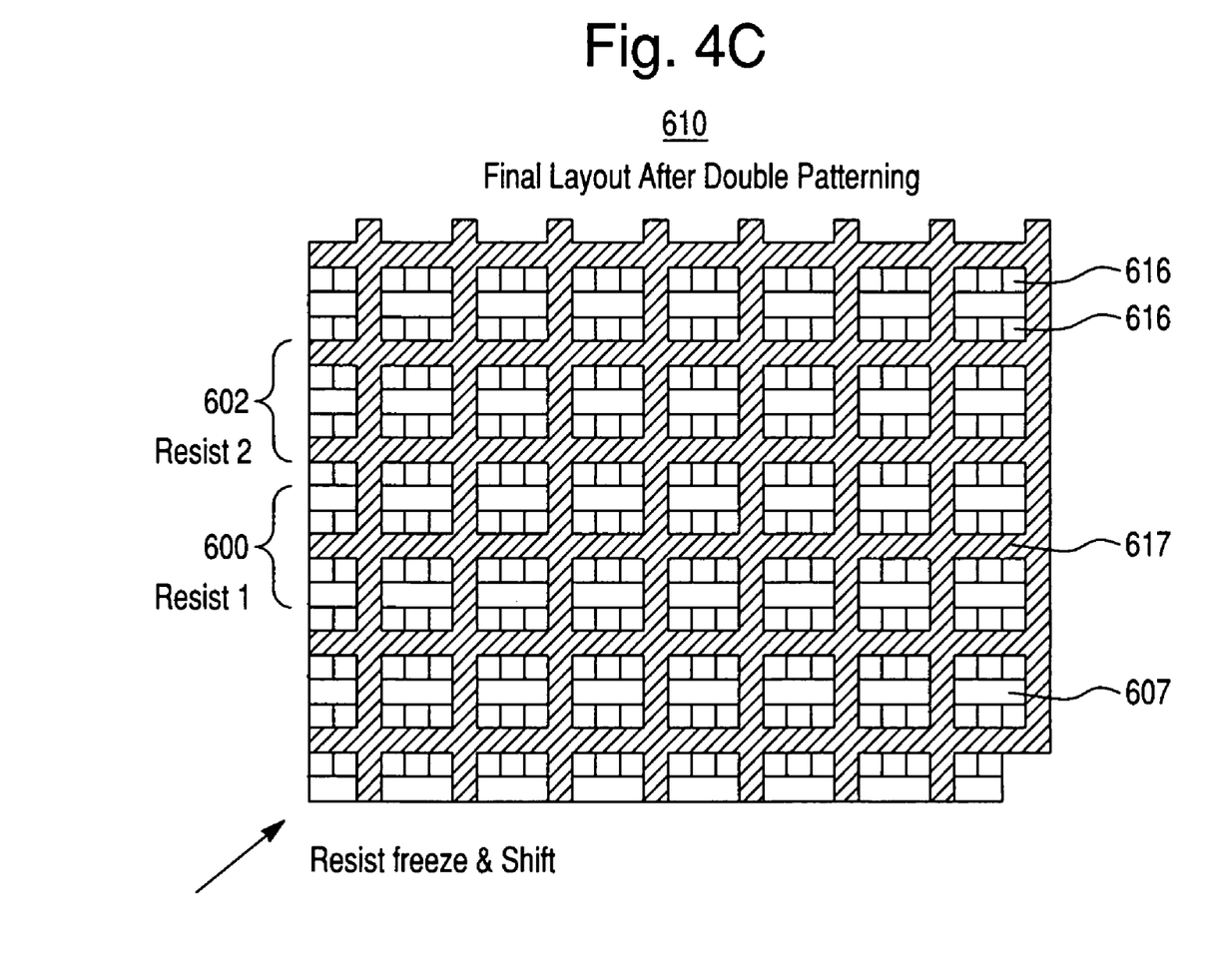

Then, a second photoresist layer is formed over the first photoresist pattern (i.e., on grid 600). The second photoresist layer is patterned to form a second photoresist pattern over the underlying layer. The second photoresist pattern comprises a second grid 602, as shown in FIG. 4B. The second grid 602 may have the same dimensions as the first grid 600, but it may be offset diagonally with respect to the first grid. Alternatively, grid 602 may also have a non-rectangular shape, as described above with respect to the first grid 600. Thus, the second grid overlaps the first grid to form a photoresist web 610, as shown in FIG. 4C.

In the web 610, a plurality of cross-shaped portions 617 of the second grid (i.e., where the vertical and horizontal segments of the grid 602 meet) are located in openings 606 in the first grid, such that one set of four openings 616 surrounds each of the plurality of cross-shaped portions 617, and each set of four openings 616 is bounded by four adjacent segments 607 of the first grid 600. Portions 617 may be centered in the openings 606 to form plural openings 616 of the same width or diameter. Alternatively, portions 617 may be located off center in the openings 606 to form plural openings 616 with different width or diameters.

The first and the second photoresist layers may be exposed through the different photo masks or through the same photo mask which is shifted diagonally during exposure of the second photoresist layer with respect to its position during exposure of the first photoresist layer.

Then, the underlying layer is patterned (i.e., etched) using the web 610 as a mask. The underlying layer portions exposed in the openings 616 in the web are etched away while the remaining portions covered by the web 610 remain. The etching may proceed as in the first embodiment to form contact holes or vias in an insulating device layer.

Figure 5:
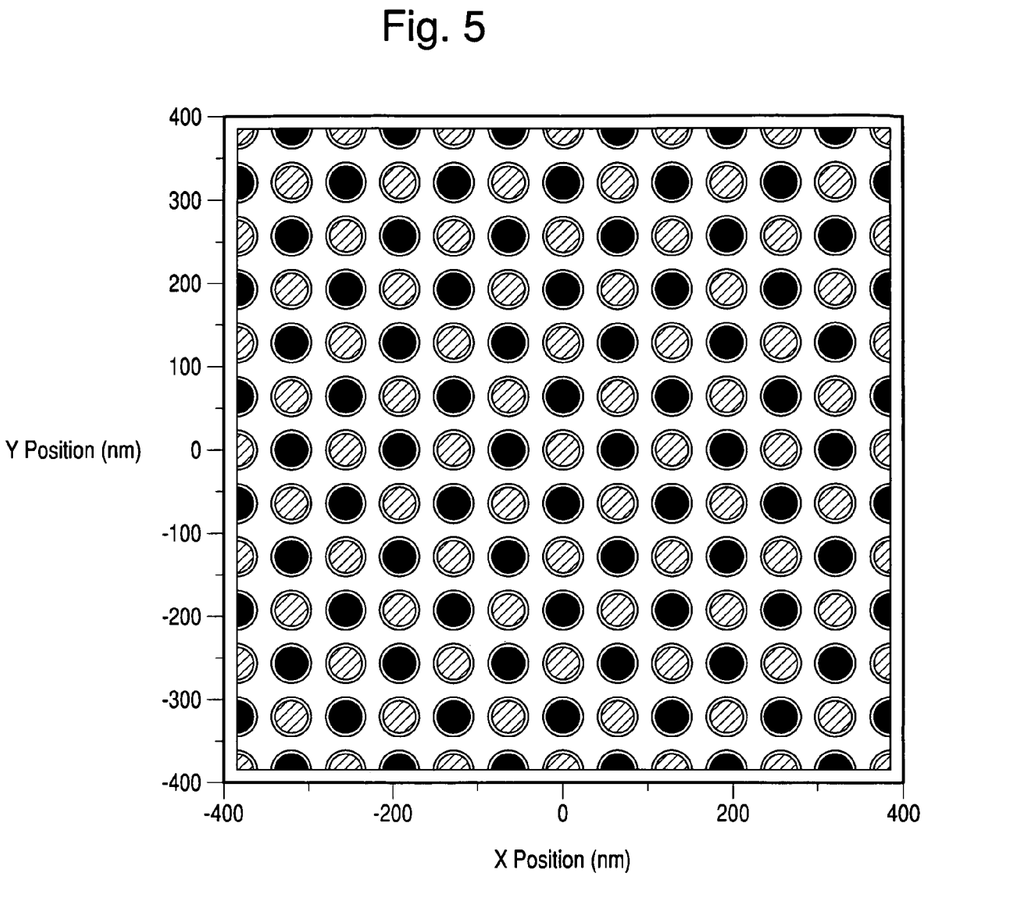
FIG. 5 is a simulated top view of a photoresist web having a critical dimension of 96 nm and a pitch of 128 nm in both the X and Y directions.

Thus, by using the web-like grid layout in combination with double patterning, with the second image shifted diagonally relative to the first, the final orientation is one of dense contact holes with the potential for further scaling through resist over-exposures (since the pitch is relaxed at 128 nm). The reticle can also be engineered such that the two individual masking layouts can be superimposed on top of each other with overlay boxes to compensate for alignment errors. Further, because the intersecting points 617 in the layout will tend to deform around the edges due to resist interaction, this could lead to a more circular openings 616 rather perfectly square shaped ones. Without wishing to be bound by a particular theory, a simulation is carried by a software called Prolith. Corner rounding is observed in the resulting web layout, as shown in FIG. 5. In some embodiments, the corner rounding effect can be corrected with rigorous optical proximity corrections (OPC). For example, serifs of various shapes and sizes can be added at the corners to correct the artifacts. The resulting web layout can be also viewed as stretched (or elongated) contact holes, having a critical dimension of 96 nm and a pitch of 128 nm in both the X and Y directions.

In another embodiment, rather than forming contact openings or vias in the device layer, pillars may be formed in the underlying layer instead. In this method, the openings 616 in the web are filled with a masking material to form a masking material pattern. The photoresist web is removed, and the underlying layer is patterned using the masking material pattern as a mask, as described with respect to the prior embodiment.

In the prior embodiments, the first photoresist pattern is "frozen". If desired, the second photoresist pattern may also be "frozen" in the same manner in order to further narrow the size of the openings in the respective grids described above.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of making a device, comprising:
   forming a first photoresist layer over an underlying layer;
   patterning the first photoresist layer to form a first photoresist pattern comprising first photoresist lines extending in a first direction;
   rendering the first photoresist pattern insoluble to a solvent;
   forming a second photoresist layer over the first photoresist pattern;
   patterning the second photoresist layer to form a second photoresist pattern over the underlying layer, the second photoresist pattern comprising second photoresist lines extending in a second direction different from the first direction;
   filling openings between the first and the second photoresist patterns with a masking material to form a masking material pattern;
   removing the first and the second photoresist patterns; and
   patterning the underlying layer using the masking material pattern.

2. The method of claim 1, wherein the underlying layer is selected from the group consisting of a BARC layer, a DARC layer, an organic hard mask layer, a device layer and combinations thereof.

3. The method of claim 2, further comprising:
   forming the organic hard mask layer over the device layer;
   forming the DARC layer over the organic hard mask layer;
   forming the BARC layer over the DARC layer;
   patterning at least one of the BARC layer and the DARC layer using the first and the second photoresist patterns as a mask;
   patterning the organic hard mask layer using at least the patterned DARC layer as a mask; and
   patterning the device layer using at least the patterned organic hard mask layer as a mask.

4. The method of claim 3, further comprising forming an oxide hard mask layer over the organic hard mask layer and under the DARC layer.

5. The method of claim 1, wherein:
   the underlying layer comprises at least one semiconductor layer; and
   the step of patterning the underlying layer forms an array of semiconductor pillars.

6. The method of claim 5, wherein each pillar in the array of pillars comprises a diode.

7. The method of claim 6, wherein:
   the diode is a steering element of a memory cell; and
   the memory cell further comprises a storage element.

8. The method of claim 7, wherein the memory cell type is selected from at least one of antifuse, fuse, polysilicon memory effect cell, metal oxide memory, switchable complex metal oxide, carbon nanotube memory, graphene or polycrystalline carbon switchable resistance material, phase change material memory, conductive bridge element, or switchable polymer memory.

9. The method of claim 8, wherein the memory cell is a read/write memory cell or a rewritable memory cell, and the memory cell is located in a monolithic three dimensional array of memory cells.

10. The method of claim 1, wherein the first photoresist layer and the second photoresist layer are exposed through a different photo mask.

11. The method of claim 1, wherein the first photoresist layer and the second photoresist layer are exposed through a same photo mask which is positioned in a different orientation with respect to the underlying layer during exposure of the first and the second photoresist layers.

12. The method of claim 1, wherein the first direction differs from the second direction by 30 to 90 degrees.

13. The method of claim 1, wherein the step of rendering the first photoresist pattern insoluble comprises forming a barrier layer on the first photoresist pattern.

14. The method of claim 13, wherein:
the first photoresist layer comprises a first composition and the second photoresist comprises a second composition which is same as or different from the first composition; and
the step of forming the barrier layer comprises reacting a reagent with the first photoresist pattern to form a monolayer crosslinked polymer coating on the first photoresist pattern.

15. A method of making a device, comprising:
forming a first photoresist layer over an underlying layer;
patterning the first photoresist layer to form a first photoresist pattern comprising a first grid;
rendering the first photoresist pattern insoluble to a solvent;
forming a second photoresist layer over the first photoresist pattern;
patterning the second photoresist layer to form a second photoresist pattern over the underlying layer, the second photoresist pattern comprising a second grid which overlaps the first grid to form a photoresist web;
etching the underlying layer using the photoresist web as a mask;
filling openings in the photoresist web with a masking material to form a masking material pattern;
removing the photoresist web; and
patterning the underlying layer using the masking material pattern.

16. The method of claim 15, wherein the underlying layer is selected from the group consisting of a BARC layer, a DARC layer, an organic hard mask layer, a device layer and combinations thereof.

17. The method of claim 16, further comprising:
forming the organic hard mask layer over the device layer;
forming the DARC layer over the organic hard mask layer;
forming the BARC layer over the DARC layer;
patterning at least one of the BARC layer and the DARC layer using the first and the second photoresist patterns as a mask;
patterning the organic hard mask layer using at least the patterned DARC layer as a mask; and
patterning the device layer using at least the patterned organic hard mask layer as a mask.

18. The method of claim 17, further comprising forming an oxide hard mask layer over the organic hard mask layer and under the DARC layer.

19. The method of claim 17, wherein:
the device layer comprises at least one insulating layer; and
the step of patterning the device layer forms contact holes in the insulating layer.

20. The method of claim 17, wherein:
the device layer comprises at least one semiconductor layer; and
the step of patterning the device layer forms an array of semiconductor pillars.

21. The method of claim 20, wherein each pillar in the array of pillars comprises a diode.

22. The method of claim 21, wherein the diode is a steering element of a memory cell and wherein the memory cell further comprises a storage element.

23. The method of claim 22, wherein the memory cell type is selected from at least one of antifuse, fuse, polysilicon memory effect cell, metal oxide memory, switchable complex metal oxide, carbon nanotube memory, graphene or polycrystalline carbon switchable resistance material, phase change material memory, conductive bridge element, or switchable polymer memory.

24. The method of claim 23, wherein the memory cell is a read/write memory cell or a rewritable memory cell, and the memory cell is located in a monolithic three dimensional array of memory cells.

25. The method of claim 15, wherein the first photoresist layer and the second photoresist layer are exposed through a different photo mask.

26. The method of claim 15, wherein the step of rendering the first photoresist pattern insoluble comprises forming a barrier layer on the first photoresist pattern.

27. The method of claim 26, wherein:
the first photoresist layer comprises a first composition and the second photoresist comprises a second composition which is same as or different from the first composition; and
the step of forming the barrier layer comprises reacting a reactive reagent with the first photoresist pattern to form a monolayer crosslinked polymer coating on the first photoresist.

28. The method of claim 15, wherein:
the first grid comprises a rectangular grid;
the second grid comprises a rectangular grid which is shifted diagonally with respect to the first grid; and
a plurality of cross-shaped portions of the second grid are located in openings in the first grid, such that one set of four openings surrounds each of the plurality of cross-shaped portions and each set of four openings is bounded by four adjacent segments of the first grid.

29. The method of claim 15, wherein at least one of the first and the second grids comprise a non-rectangular grid.

* * * * *